US008642981B1

(12) United States Patent
Petric et al.

(10) Patent No.: US 8,642,981 B1
(45) Date of Patent: Feb. 4, 2014

(54) ELECTRON MICROSCOPE ASSEMBLY FOR VIEWING THE WAFER PLANE IMAGE OF AN ELECTRON BEAM LITHOGRAPHY TOOL (71) Applicant: KLA-Tencor Corporation, Milpitas, CA (US)

(72) Inventors: Paul Petric, Pleasanton, CA (US); Mark A. McCord, Los Gatos, CA (US); Michael Madsen, Hollister, CA (US); Alan Brodie, Palo Alto, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 13/753,657

(22) Filed: Jan. 30, 2013

Related U.S. Application Data (60) Provisional application No. 61/593,713, filed on Feb. 1, 2012.

(51) Int. Cl.
*H01J 49/00* (2006.01)
(52) U.S. Cl.
USPC ........ 250/492.3; 250/306; 250/307; 250/310; 250/311; 250/492.1

(58) Field of Classification Search
USPC ............ 250/306, 307, 310, 311, 492.1–492.3
See application file for complete search history.

(56) References Cited

U.S. PATENT DOCUMENTS 8,350,237 B2 * 1/2013 Tanner ....................... 250/492.3

* cited by examiner

*Primary Examiner* — Michael Maskell
(74) *Attorney, Agent, or Firm* — Suiter Swantz pc llo (57) ABSTRACT

An electron microscope assembly suitable for enhancing an image of a lithography tool includes an electron microscope configured for positioning below a lithography stage of an e-beam lithography tool, the lithography stage of the e-beam lithography tool including an aperture for providing the microscope line-of-sight to the lithography optics of the lithography tool, a translation unit configured to selectively translate the microscope along the optical axis of the lithography optics of the lithography tool responsive to a translation control system, the translation unit further configured to position the microscope in an operational state such that the optics of the microscope are positioned proximate to the lithography optics, a docking unit configured to reversibly mechanically couple the microscope with the lithography tool, the microscope configured to magnify a virtual sample plane image generated by the lithography tool.

39 Claims, 7 Drawing Sheets

ELECTRON MICROSCOPE ASSEMBLY FOR VIEWING THE WAFER PLANE IMAGE OF AN ELECTRON BEAM LITHOGRAPHY TOOL

GOVERNMENT LICENSE RIGHTS

The U.S. Government has a paid-up license in this invention and the right in limited circumstances to require the patent owner to license others on reasonable terms as provided for by the terms of Contract No. HR0011-07-9-0007 awarded by the Defense Advanced Research Projects Agency.

CROSS-REFERENCE TO RELATED APPLICATION

The present application is related to and claims the benefit of the earliest available effective filing date(s) from the following listed application(s) (the "Related Applications") (e.g., claims earliest available priority dates for other than provisional patent applications or claims benefits under 35 USC §119(e) for provisional patent applications, for any and all parent, grandparent, great-grandparent, etc. applications of the Related Application(s)).

RELATED APPLICATIONS

For purposes of the USPTO extra-statutory requirements, the present application constitutes a regular (non-provisional) patent application of United States Provisional Patent Application entitled An Electron Optical Microscope For Viewing The Wafer Plane Image Of An Electron Beam Lithography Machine, naming Paul Petric, Mark A. McCord, Michael Madsen and Alan Brodie as inventors, filed Feb. 1, 2012, Application Ser. No. 61/593,713.

TECHNICAL FIELD

The present invention generally relates to electron optical microscopy, and more particularly to an electron optical microscope suitable for viewing the wafer plane image of an electron beam lithography tool.

BACKGROUND

A lithographic process includes the patterned exposure of a resist allowing portions of the resist to be selectively removed, thereby exposing underlying areas for selective processing, such as etching, material deposition, ion implantation and the like. Typically, lithographic processes utilize ultraviolet light for selective exposure of the resist. In addition, charged particle beams (e.g., electron beams) have been used for high resolution lithographic resist exposure. The use of e-beam based lithography systems allows for relatively accurate control of the electron beam at relatively low power and relatively high speed.

In order to improve lithographic processes, various parameters of the electron beam from the lithography tool may be measured. Typically, parameters such as focus, astigmatism, magnification, rotation, distortion and uniformity are measured utilizing a "knife edge" technique. In this regard, the electron beam or image is scanned across a knife edge and the signal is measured utilizing either a backscatter detector or transmission detector.

The commonly implemented knife edge technique suffers from difficulties in forming a knife edge having nanometer scale sharpness and edge roughness. In addition, it is difficult to measure rotation and magnification accurately using the knife edge technique as one is limited to measuring one axis at a time. Therefore, it is desirable to provide a system and method that cures the defects of the prior art.

SUMMARY

A system for providing electron beam lithography image enhancement is disclosed. In a first aspect, the system may include, but is not limited to, an electron beam lithography tool; an electron microscope positioned below a lithography stage of the electron beam lithography tool, the stage of the electron beam lithography tool including an aperture suitable for providing the electron microscope line-of-sight to one or more lithography optics of the electron beam lithography tool, the electron microscope including one or more magnifying lenses oriented about the optical axis of the electron microscope; a translation unit configured to selectively translate the electron microscope along the optical axis of one or more lithography optics of the electron beam lithography tool responsive to a translation control system, the translation unit further configured to position the electron microscope in an operational state such that one or more optics of the electron microscope are positioned proximate to the one or more lithography optics, the one or more magnifying lenses of the electron microscope configured to magnify a virtual sample plane image generated by the electron beam lithography tool.

In another aspect, the system may include, but is not limited to, an electron beam lithography tool, the electron beam lithography tool including a lithography stage, the lithography stage disposed within a lithography tool vacuum chamber; an electron microscope (e.g., miniature electron microscope) embedded within the lithography stage of the electron beam lithography tool, the electron microscope including one or more magnifying lenses oriented about an optical axis of the electron microscope, wherein the electron microscope is disposed within the lithography tool vacuum chamber, the electron microscope arranged within the lithography stage of the electron beam lithography tool such that the electron microscope has a line-of-sight to one or more lithography optics of the electron beam lithography tool, the one or more magnifying lenses of the electron microscope configured to magnify a virtual sample plane image generated by the electron beam lithography tool.

An electron microscope assembly is disclosed. In a first aspect, the system may include, but is not limited to, an electron microscope configured for selectable positioning below a lithography stage of an electron beam lithography tool, the lithography stage of the electron beam lithography tool including an aperture suitable for providing the electron microscope line-of-sight to one or more lithography optics of the electron beam lithography tool; a translation unit configured to selectively translate the electron microscope along the optical axis of one or more lithography optics of the electron beam lithography tool responsive to a translation control system, the translation unit further configured to position the electron microscope in an operational state such that one or more optics of the electron microscope are positioned proximate to the one or more lithography optics; a docking unit configured to reversibly mechanically couple the electron microscope with the electron beam lithography tool, the electron microscope configured to magnify a virtual sample plane image generated by the electron beam lithography tool.

A method for providing electron beam lithography image enhancement is disclosed. In a first aspect, the method may include, but is not limited to, providing an electron microscope including one or more magnifying lenses oriented about an optical axis of the electron microscope; selectably positioning the electron microscope below an aperture of a lithography stage of an electron beam lithography tool such that the electron microscope has a line-of-sight to one or more lithography optics of the electron beam lithography tool; magnifying a virtual sample plane image generated by the electron beam lithography tool utilizing the one or more magnifying lenses; projecting the magnified virtual sample plane image onto an imaging device of the electron microscope; and collecting image information from the imaging device.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention. Reference will now be made in detail to the subject matter disclosed, which is illustrated in the accompanying drawings.

Figure 1A:
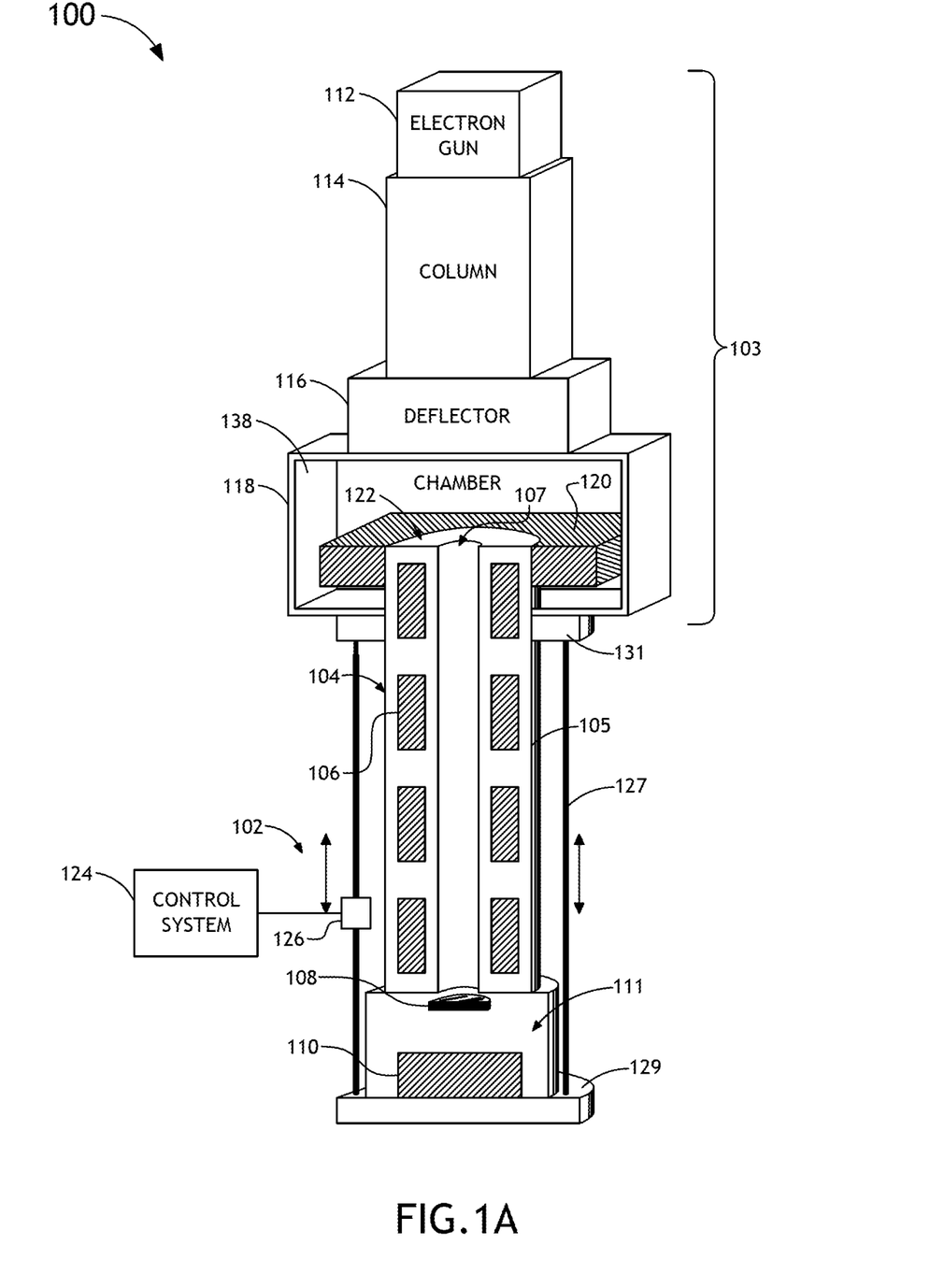
FIG. 1A is a schematic view of a system for providing electron beam lithography image enhancement, in accordance with one embodiment of the present invention.
Figure 1B:
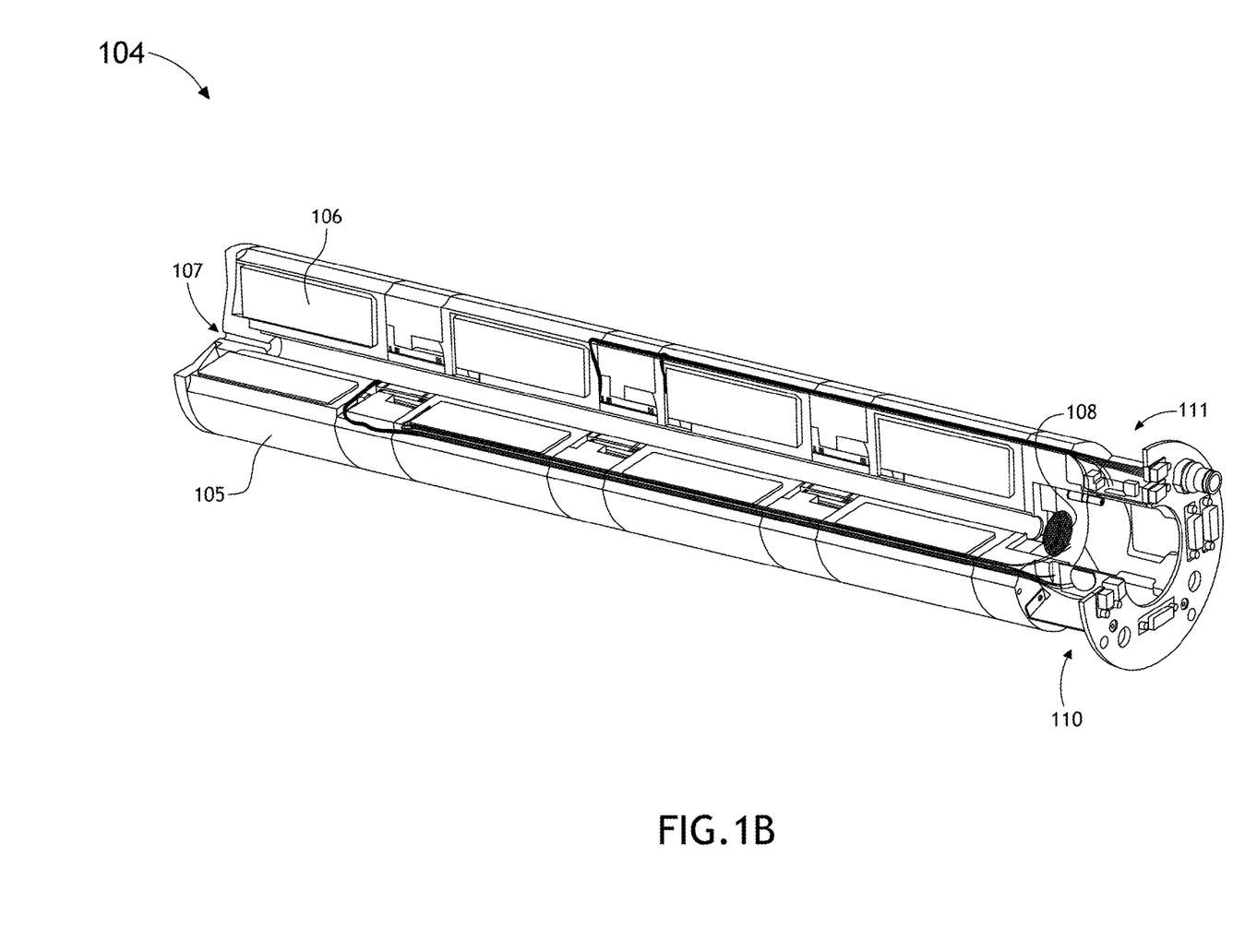
FIG. 1B is a schematic view of an electron microscope, in accordance with one embodiment of the present invention.
Figure 1C:
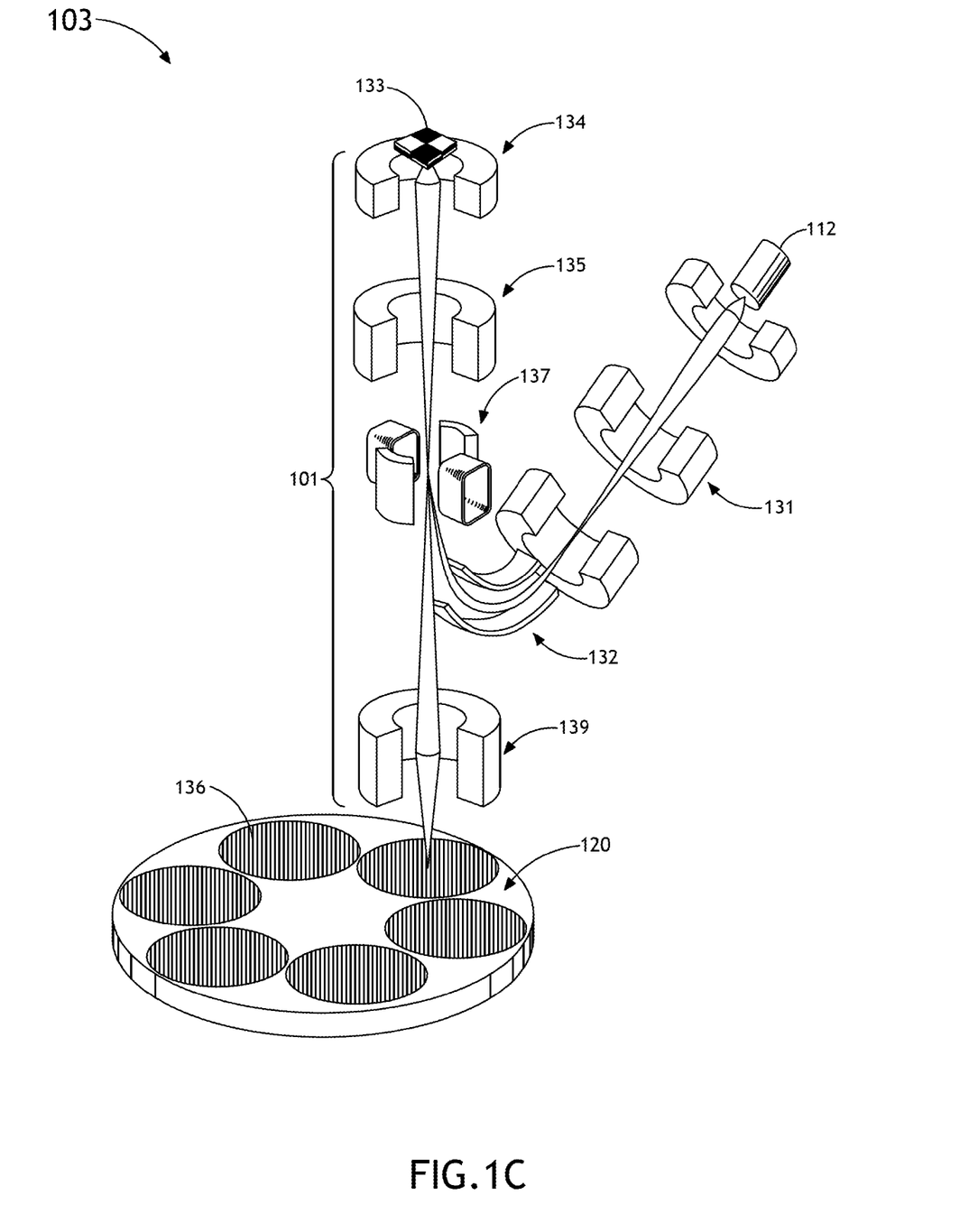
FIG. 1C is a schematic view of a reflective electron beam lithography tool, in accordance with one embodiment of the present invention.
Figure 1D:
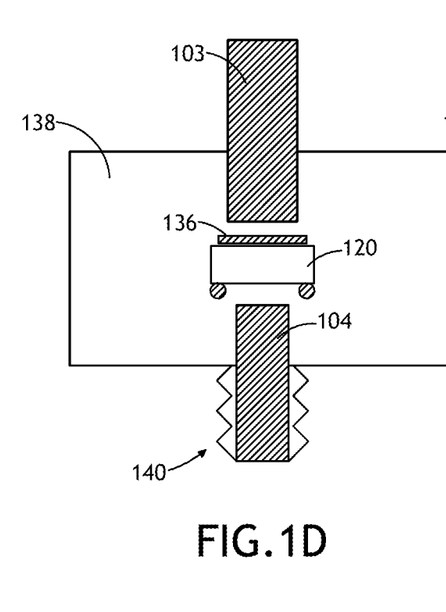
FIG. 1D is a conceptual view of system for providing electron beam lithography enhancement when in a normal writing configuration, in accordance with one embodiment of the present invention.
Figure 1E:
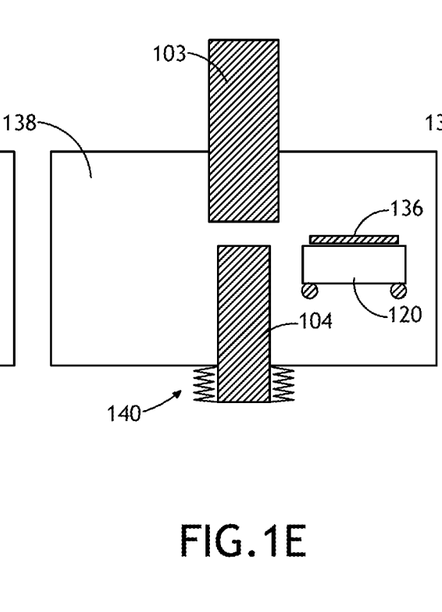
FIG. 1E is a conceptual view of system for providing electron beam lithography enhancement with a stage of the system in a retracted configuration, in accordance with one embodiment of the present invention.
Figure 1F:
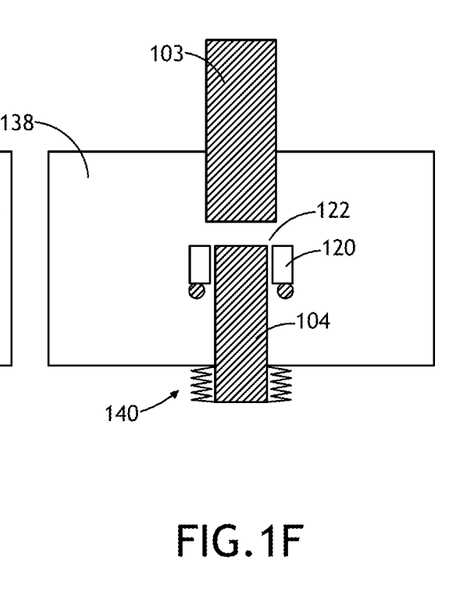
FIG. 1F is a conceptual view of system for providing electron beam lithography enhancement with the electron microscope provided line-of-sight to the lithography tool optics via an aperture, in accordance with one embodiment of the present invention.
Figure 1G:
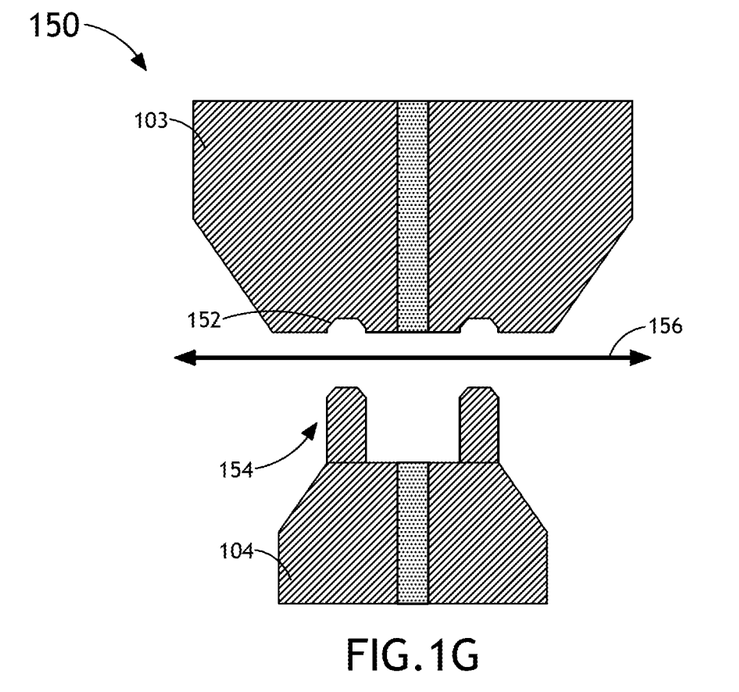
FIG. 1G is a schematic view of a docking system of the system for providing electron beam lithography enhancement while in a disengaged configuration, in accordance with one embodiment of the present invention.
Figure 1H:
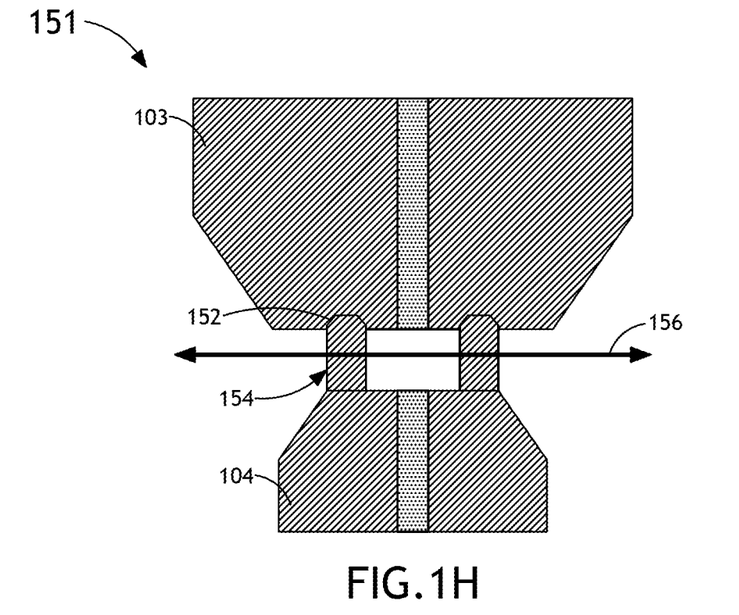
FIG. 1H is a schematic view of a docking system of the system for providing electron beam lithography enhancement while in an engaged configuration, in accordance with one embodiment of the present invention.
Figure 1I:
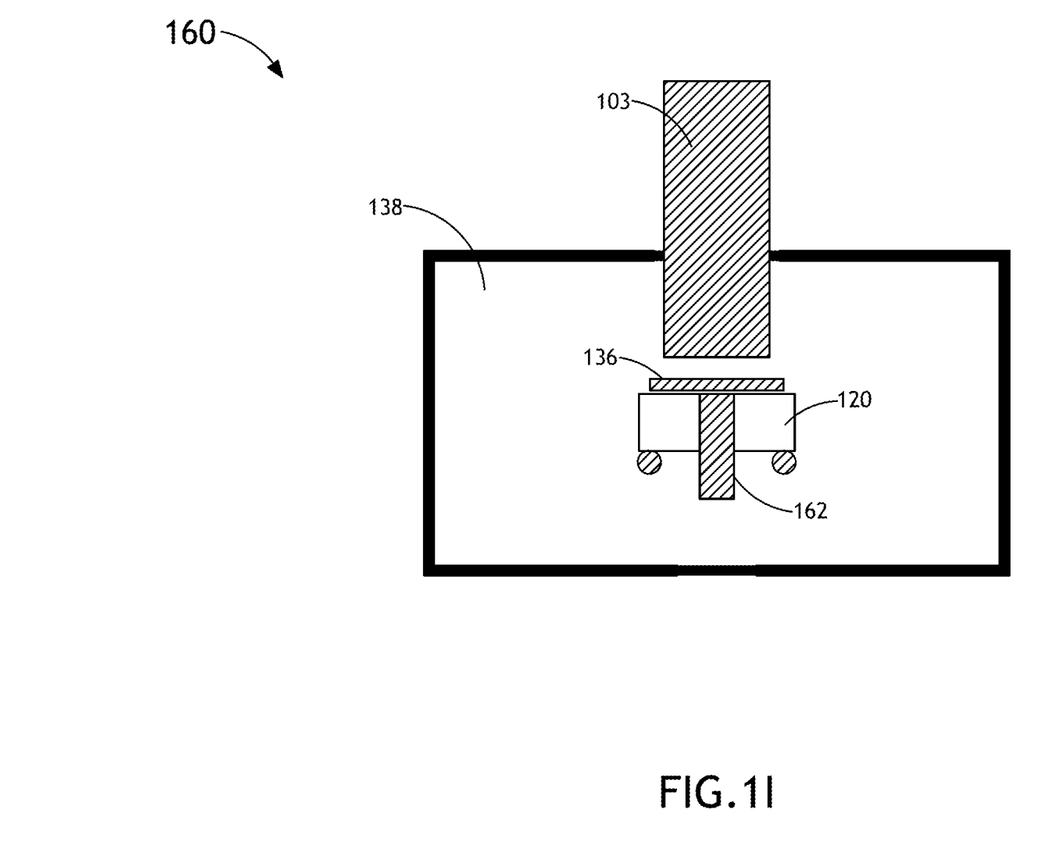
FIG. 1I is a conceptual view of a system for providing electron beam lithography enhancement with a miniature electron microscope coupled directly to the lithography stage of the lithography tool, in accordance with one embodiment of the present invention.

Referring generally to FIGS. 1A and 1I, a system 100 for providing electron beam lithography image enhancement is disclosed in accordance with the present invention. The present invention is directed to a system 100 including an electron microscope assembly and electron beam lithography tool suitable for providing electron beam lithography image enhancement. The electron microscope of the present invention is configured to allow a user to visualize the aerial image produced by the optics of the corresponding lithography tool. Further, the system 100 allows for the measurement of the aerial image at the sample, which, in turn, allows for the enhancement (e.g., optimization) of one or more optical conditions of the lithography tool. In this regard, the image produced at the sample plane of the lithography tool can be optimized, or at least enhanced. The system 100 allows for the measurement and optimization (or at least enhanced) of various optical conditions such as, but not limited to, alignment of the various optical components, focus, astigmatism, magnification, rotation, distortion, resolution, contrast, and image uniformity.

It is recognized herein that the electron microscope of the present invention may include a high magnification electron microscope (e.g., microscope capable of measuring features on the order of 10 nm), thereby allowing the measurements of additional optical features, such as, but not limited to, image blur. It is further recognized that in lithographic settings, such as reflective electron beam lithography, where a collection of points or an entire image is projected onto the wafer (as opposed to a pixel-by-pixel approach), two-dimensional image enhancement as described in the present disclosure is particularly useful.

FIGS. 1A and 1B illustrate a schematic view of a system 100 for providing electron beam lithography image enhancement in accordance with an embodiment of the present invention. In one aspect, the system 100 includes an electron beam lithography tool 103 and an electron microscope 104 of an electron microscope assembly 102 positioned below a lithography stage 120 of the lithography tool 103. The lithography stage 120 of the lithography tool 103 includes an aperture 122 configured to provide the electron microscope 104 with a line-of-site to one or more lithography optics of the lithography tool 103. In this regard, the aperture 122 of the lithography stage 120 allows the electron image formed at the sample plane to be transmitted through the stage location and on to the optics of the electron microscope 104.

In another aspect of the present invention, the system 100 includes a translation unit 126 configured to selectably translate the electron microscope 104 of the assembly 102 along the optical axis of one or more lithography optics of the electron beam lithography tool 103 in response to a translation control system 124. In this regard, the translation unit 126 may selectably position the electron microscope 104 in an operational state such that one or more optics of the electron microscope 104 are positioned proximate to the one or more lithography optics. It is recognized herein that the placement of the optics (e.g., magnetic lenses 106) of the electron microscope 104 in close proximity to the lithography optics of the lithography tool 103 provides for improved resolution. For instance, in settings where imaging conditions of the lithography tool 103 need improved or optimized, a translation unit 126 may raise the electron microscope 104 such that the uppermost portion of the microscope 104 is passed through the aperture 122 of the lithography stage 120, allowing the microscope 104 to obtain a magnified view of the virtual wafer image. In a preferred embodiment, while in the operational state, electron microscope 104 is elevated such that the microscope 104 is in contact with the lowermost lens of the lithography optics of the lithography tool 103.

In another embodiment, the stage 120 of the lithography tool 103 may be retractable. In this regard, the stage 120 of the lithography tool 103 may be translated along a selected direction such that the stage 120 no longer intersects with the optical axis of the lithography tool 103

In a further aspect, the electron microscope 104 includes one or more magnifying lenses 106. In one embodiment, the one or more magnifying lenses include a plurality of magnifying lenses 106 (e.g., magnetic lenses or electrostatic lenses) oriented about the optical axis of the electron microscope 104. In another embodiment, the electron microscope 104 includes a single magnifying lens (not shown) (e.g., magnetic lens or electrostatic lens) oriented about the optical axis of the electron microscope. Upon establishment of an operation state, the plurality of magnifying lenses 106 of the electron microscope 104 may magnify a virtual sample plane image generated by the electron beam lithography tool 103.

In a further aspect, the electron microscope 104 may include one or more imaging devices 111. In this regard, the one or more imaging devices 111 are configured to image the magnified electron image of the electron microscope 104. In one embodiment, the one or more imaging devices 108 may image the virtual sample plane image magnified by the optics 106 of the electron microscope 104.

In one embodiment, the imaging device 111 of the electron microscope 104 may include an electron imaging screen 108. The electron imaging screen 108 may include any imaging screen known in the art. For example, the imaging screen may include a fluorescent imaging screen configured to emit light in response to an absorbed electron pattern. For instance, the imaging screen may include, but is not limited to, a YAP screen, a YAG screen, or a phosphorous screen. It is recognized herein that the electron imaging screen may generate a light image in response to the absorption of a given magnified electron image.

In an additional embodiment, the imaging device 111 of electron microscope 104 may include a camera 110 configured to collect the light image generated by the electron imaging screen 108. The camera 110 of the electron microscope 104 may include any detector or camera known in the art suitable for collecting imagery data from an electron imaging screen. For example, the camera 110 may include, but is not limited to, a CCD detector or a CMOS detector.

In another embodiment, the imaging device 111 of the electron microscope 104 may include, but is not limited to, a direct imaging sensor (not shown) configured to directly image the virtual sample plane image magnified by the optics 106 of the electron microscope 104. In this regard, the electron image magnified by the optics 106 of the electron microscope 104 may be directly imaged using a sensor without the need of an intervening imaging screen (such as screen 108). For example, the direct imaging sensor of the electron microscope 104 may include, but is not limited to a CCD detector or a CMOS detector suitable for receiving and imaging a magnified electron image from the optics 106 of the electron microscope 104.

In a preferred embodiment, the electron microscope 104 may include four magnetic magnifying lenses 106 arranged about an optical axis of the electron microscope 104. After the electron microscope 104 is placed in proximity with the lithography optics of the lithography tool 103, the four magnifying lenses 106 of the electron microscope 104 may magnify a virtual sample plane image generated by the electron beam lithography tool 103 and project the image onto an electron imaging screen 108. The camera 110 may then collect light pattern information generated by the interaction of electrons of an electron pattern with the imaging screen 108. It is noted herein that the use of four magnetic lenses 106 may supply a magnification of approximately 1000× to 10,000× onto the electron imaging screen 108.

Referring now to FIG. 1C, in one aspect of the present invention, the electron beam lithography tool 103 of the system 100 may include a reflective electron beam lithography (REBL) tool. FIG. 1C illustrates a simplified schematic view of a REBL tool 103, in accordance with one embodiment of the present invention. The REBL tool 103 may include an electron gun 112, a set of electron beam illumination optics 131, and an electrostatic bender 132, which together act to direct an electron beam onto a digital pattern generator (DPG) chip 133. The DPG chip 133 is used for generating patterns on one or more wafer 136, whereby the programmed pattern of the DPG chip 133 is scanned across one or more wafers 136 disposed on the stage 120 of the lithography tool 103. In another embodiment, projection optics 101 are utilized to direct a projection e-beam from the surface of the DPG chip 133 onto the surface of the one or more wafers 136. Further, the projection optics 103 are configured to focus and demagnify the electron beam onto a portion of the one or more wafers 136. In one embodiment, the projection optics 101 may include a DPG lens 134. In another embodiment, the projection optics may include an upper demagnification lens 135 and a lower demagnification lens 139. In another embodiment, the projection optics 101 may include an ExB filter 134 (e.g., Wien Filter) consisting of crossed electrostatic and magnetic deflection fields suitable for separating the projection beam from the illumination beam. A REBL based lithograph tool suitable for implementation in the present invention is described generally in U.S. Pat. No. 7,566,882, issued on Jul. 28, 2009, which is incorporated herein in the entirety.

Referring again to FIGS. 1A and 1B, the translation unit 126 of the present invention may include any translation device suitable for selectably translating the electron microscope 104 into and out of the operation state (i.e., entrance optics of microscope 104 placed in proximity to lithography optics of lithography tool 103). For example, the translation unit 126 may include, but is not limited to, one or more motorized screw devices configured to translate along one or more guide rails 127 (e.g., threaded guided rail). The guide rails 127 may be attached to a base plate 129 positioned at the bottom end of the electron microscope 104 and a top plate 131 positioned at the upper end of the electron microscope 104 and attached to the bottom portion of the lithography tool 103. In this regard, the motorized screw device, in response to a control system 124, may elevate the electron microscope 104 up to the lithography stage 120 of the lithography tool 103 in settings where the use of the electron microscope 104 is desired. In contrast, in settings where it is desirable to disengage the electron microscope 104, the motorized screw device may lower the electron microscope 104 away from the lithography tool 103.

In one embodiment, the translation control system 124 may include one or more computer processors configured to control the translation unit 126. In addition, the one or more computer processors of the control system 124 may be configured to receive user input via a user input device (e.g., switch, keyboard, mouse, touchpad, joystick and the like). In a general sense, the control system 124 may include any computational device known in the art. The control system 124 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium. Program instructions implementing methods such as those described herein may be transmitted over or stored on carrier medium. The carrier medium may be a transmission medium such as a wire, cable, or wireless transmission link. The carrier medium may also include a permanent storage medium such as a read-only memory, a random access memory, a magnetic or optical disk, or a magnetic tape.

In another embodiment, the system 100 may further include a microscope containment unit 105 configured to provide a vacuum barrier between one or more optical elements (e.g., magnifying lenses 106) of the electron microscope 104 and a low pressure environment of a vacuum chamber of the lithography tool 103. In a further embodiment, the microscope containment unit 105 may include a hollow cylindrical structure (e.g., hollow metal cylindrical structure) configured to encompass the electron microscope 104 and containing one or more feed-through ports for allowing power and control signals to be passed from the internal region of the containment unit to a region external to the containment unit.

In a further aspect of the present invention, as shown in FIGS. 1D-1F, the electron microscope 104 of system 100 may be disposed within a bellows assembly 140 suitable for allowing the selectable translation of the electron microscope 104 into and out of the operation state. In one embodiment, the bellows assembly 140 is configured to provide a vacuum barrier between the optical elements of the electron microscope 104 and the external environment. It is noted herein that the magnetic coils 106 of the electron microscope 104 should be isolated from the high vacuum environment of the chamber 118 of the lithography tool 103 when the microscope 104 is in the engaged position. In an additional embodiment, the bellows assembly 140 may encompass the external surface of the microscope containment unit 105 (see FIGS. 1D-1F), thereby aiding in establishing and maintaining a vacuum barrier between the between the optical elements of the electron microscope 104 and the external environment.

FIGS. 1D-1F further illustrate various operational configurations of the system 100 are illustrated, in accordance with some embodiments of the present invention. FIG. 1D depicts the system 100 arranged in a normal writing mode, whereby the electron microscope 104 is disengaged from stage 120 and lithography tool 103. FIGS. 1E and 1F illustrate configurations wherein the electron microscope 104 is raised into a position proximate to the optics of the lithography tool 103. It is noted herein that in settings where the imaging conditions need to be optimized the optics 106 of the electron microscope 104 may be raised into operating position proximate to the optics of the lithography tool 103 and the virtual sample plane. FIG. 1E depicts a setting wherein the stage 120 is retracted along a direction generally perpendicular to the optical axis of the electron microscope 104 and/or lithography tool 103. For example, the stage 120 may be coupled to any actuation unit known in the art. In response to a control signal, the actuation unit may act to translate the stage 120 such that it no longer intersects with the optical axis of the electron microscope 104 and/or lithography tool 103. Similarly, the actuation unit may act to move the stage 120 back into a position suitable for writing to the sample 136 (i.e., sample is align with lithography optics 103 in a manner to allow for normal lithographic writing mode).

FIG. 1F depicts a setting wherein the electron microscope 104 is engaged with the optics of the lithography tool 103 via the aperture 122. In this regard, in settings where the imaging conditions need to be optimized (or at least improved), the control system 124 may direct the translation unit 126 to raise the electron microscope 104 into operating position via the aperture 122, as discussed previously herein. In one embodiment, the electron microscope 104 may be engage with the lithography tool 103 when the sample 136 when the wafer is in the normal writing position. In another embodiment, the sample 136 may need to be removed from the normal writing position before the electron microscope 104 is engaged with the lithography tool 103.

FIGS. 1G and 1H illustrate a docking system of system 100 in a disengaged configuration 150 and an engaged configuration 152, in accordance with one embodiment of the present invention. The docking system is configured to provide for repeatable positioning of the electron microscope 104 beneath the lithography tool 103 and along the optical axis of the lithography optics of the lithography tool 103. In one embodiment, the docking system may include a first docking unit 152 disposed on a portion of the lithography tool 103 and a second docking unit 154 disposed on a portion of the electron microscope 104. For instance, the docking system may include a female docking unit 152 mounted on a portion of the lithography tool 103 and a male docking unit 154 mounted on a portion of the electron microscope 104. Insertion of the male docking unit 154 of the electron microscope 104 into the female docking unit 152 of the lithography tool 103 allows for improvement in positioning accuracy and provides a means for repeated and accurate engagement 151 and disengagement 150 of the electron microscope 104. The plane of the wafer 136 is indicated by arrow 156.

FIG. 1I illustrates a conceptual view 160 of system 100 having an electron microscope 162 attached directly to the lithography stage 120, in accordance with one embodiment of the present invention.

In one embodiment, the electron microscope 162 is embedded within the lithography stage 120 of the electron beam lithography tool 103. In another embodiment, the electron microscope 162 is disposed within the interior region of the vacuum chamber 138 of the lithography tool 103. In another embodiment, the electron microscope 104 is arranged within the lithography stage 120 of the electron beam lithography tool 103 such that the electron microscope 104 has a line-of-sight to one or more lithography optics of the electron beam lithography tool 103.

In one embodiment, the electron microscope 162 may include a miniature electron microscope 162. For example, the miniature electron microscope 162 may be small enough to mount directly into the stage 120 of system 100 and to fit within the vacuum chamber 138 of the system 100, as shown in FIG. 1I.

It is further noted that the various embodiments and features described previously herein with respect to the electron microscope 104 should be interpreted to extend to the embedded electron microscope 162 unless otherwise noted.

Figure 2:
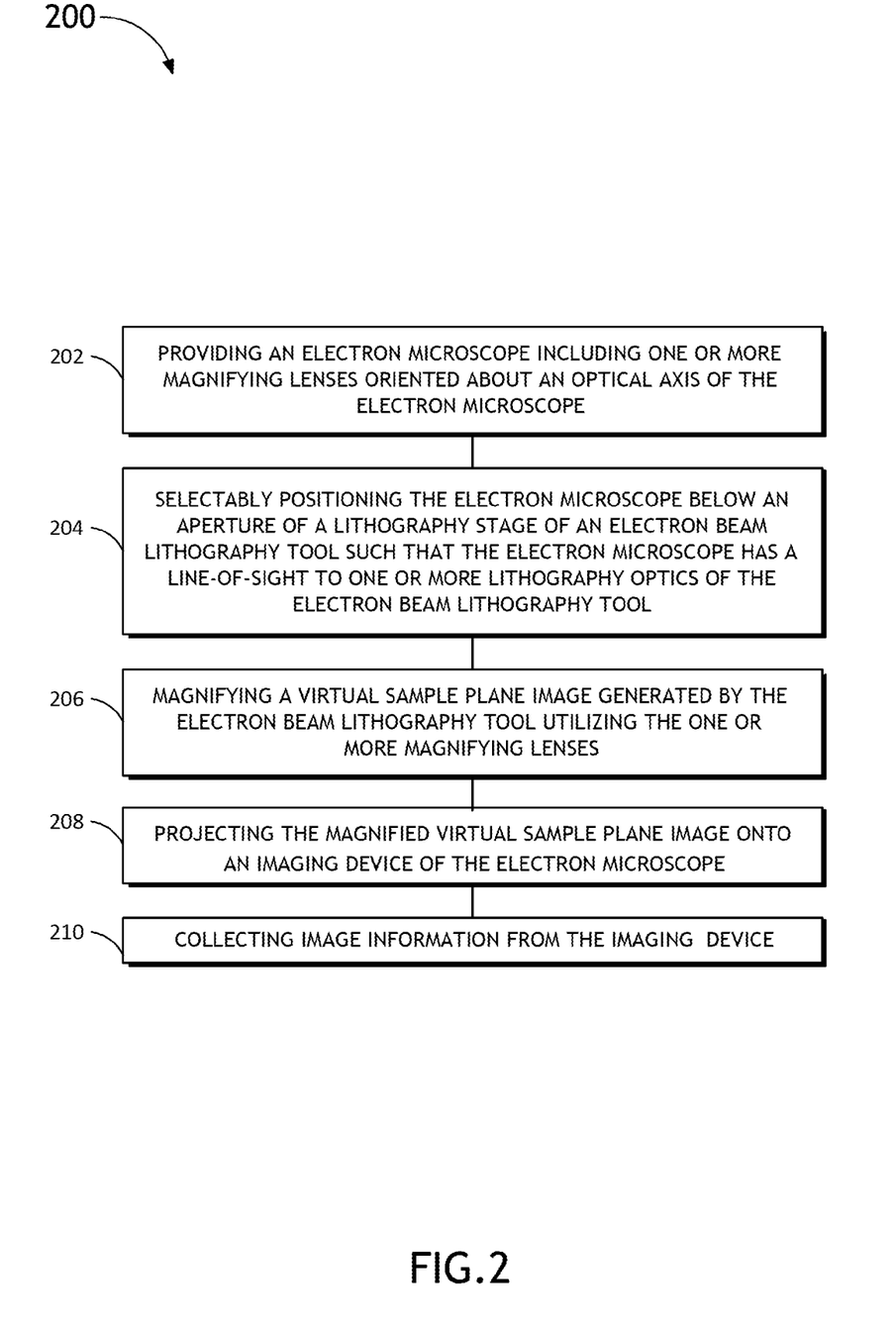
FIG. 2 is a flow diagram depicting a method for providing electron beam lithography image enhancement, in accordance with one embodiment of the present invention.

FIG. 2 illustrates a process flow diagram depicting a method for engaging the electron microscope 104 with the lithography tool 103 of system 100, in accordance with one embodiment of the present invention. In step 202, an electron microscope 104 is provided. In one embodiment, the electron microscope may include one or more magnifying lenses (e.g., magnetic lenses or electrostatic lenses) oriented about an optical axis of the electron microscope 104. In one embodiment, the electron microscope 104 may include a plurality of magnifying lenses. In another embodiment, the electron microscope 104 may include a single magnifying lens. In step 204, the electron microscope 104 is selectably (and reversibly) positioned below an aperture of a lithography stage 120 of an electron beam lithography tool 103 such that the electron microscope 104 has a line-of-sight to one or more lithography optics of the electron beam lithography tool 103. In step 206, a virtual sample plane image generated by the electron beam lithography tool is magnified utilizing the one or more magnifying lenses. In step 208, the magnified virtual sample plane image is projected onto an imaging device of the electron microscope. In step 210, image information associated with the magnified image is collected from the imaging device.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

What is claimed:

1. A system for providing electron beam lithography image enhancement, comprising:
    an electron beam lithography tool;
    an electron microscope positioned below a lithography stage of the electron beam lithography tool, the stage of the electron beam lithography tool including an aperture suitable for providing the electron microscope line-of-sight to one or more lithography optics of the electron beam lithography tool, the electron microscope including one or more magnifying lenses oriented about the optical axis of the electron microscope;
    a translation unit configured to selectively translate the electron microscope along the optical axis of one or more lithography optics of the electron beam lithography tool responsive to a translation control system,
    the translation unit further configured to position the electron microscope in an operational state such that one or more optics of the electron microscope are positioned proximate to the one or more lithography optics, the one or more magnifying lenses of the electron microscope configured to magnify a virtual sample plane image generated by the electron beam lithography tool.

2. The system of claim 1, wherein the one or more magnifying lenses comprise:
    a plurality of magnifying lenses.

3. The system of claim 1, wherein the one or more magnifying lenses comprise:
    a single magnifying lens.

4. The system of claim 1, wherein the one or more magnifying lenses comprise:
    one or more magnetic magnifying lenses.

5. The system of claim 1, wherein the one or more magnifying lenses comprise:
    one or more electrostatic magnifying lenses.

6. The system of claim 1, wherein the electron microscope includes at least one imaging device configured to image the magnified sample plane image.

7. The system of claim 6, wherein the electron microscope includes at least one electron imaging screen.

8. The system of claim 7, wherein the electron imaging screen comprises:
    at least one of a YAG screen, a YAP screen, and a phosphorous screen.

9. The system of claim 6, wherein the electron microscope includes at least one camera configured to collect one or more light images emitted by the at least one electron imaging screen.

10. The system of claim 6, wherein the electron microscope includes at least one direct imaging sensor configured to directly image the virtual sample plane image.

11. The system of claim 10, wherein the at least one direct imaging sensor includes at least one of a CCD detector or a CMOS detector.

12. The system of claim 1, wherein the translation unit comprises:
    one or more motorized screw devices; and
    one or more threaded guide rails, wherein the one or more motorized screw devices are configured to translate the electron microscope via the one or more threaded guide rails.

13. The system of claim 1, further comprising:
    a microscope containment unit configured to provide a vacuum barrier between one or more optical elements of the electron microscope and a low pressure environment of a vacuum chamber of the lithography tool.

14. The system of claim 1, further comprising:
    a bellows assembly configured to selectively translate the electron microscope along the optical axis of one or more lithography optics of the electron beam lithography tool, the electron microscope disposed on the bellows assembly.

15. The system of claim 14, wherein the bellows assembly is further configured to provide a vacuum barrier between one or more optical elements of the electron microscope and a low pressure environment of a vacuum chamber of the lithography tool.

16. The system of claim 1, further comprising:
    a docking system configured to reversibly mechanically couple a portion of the electron microscope with a portion of the lithography tool such that the optical axis of the lithography tool is substantially aligned with the optical axis of the electron microscope.

17. The system of claim 16, wherein the docking system comprises:
    a first docking unit disposed on the electron microscope; and a second docking unit disposed on the lithography tool, wherein the first docking unit is configured to reversibly mechanically couple with the second docking unit.

18. An electron microscope assembly, comprising:
an electron microscope configured for selectable positioning below a lithography stage of an electron beam lithography tool, the lithography stage of the electron beam lithography tool including an aperture suitable for providing the electron microscope line-of-sight to one or more lithography optics of the electron beam lithography tool;
a translation unit configured to selectively translate the electron microscope along the optical axis of one or more lithography optics of the electron beam lithography tool responsive to a translation control system, the translation unit further configured to position the electron microscope in an operational state such that one or more optics of the electron microscope are positioned proximate to the one or more lithography optics;
a docking unit configured to reversibly mechanically couple the electron microscope with the electron beam lithography tool, the electron microscope configured to magnify a virtual sample plane image generated by the electron beam lithography tool.

19. The system of claim 18, wherein the electron microscope includes at least one imaging device configured to image the magnified sample plane image.

20. The system of claim 19, wherein the electron microscope includes at least one electron imaging screen.

21. The system of claim 20, wherein the electron imaging screen comprises:
at least one of a YAG screen, a YAP screen, and a phosphorous screen.

22. The system of claim 19, wherein the electron microscope includes at least one camera configured to collect one or more light images emitted by the at least one electron imaging screen.

23. The system of claim 19, wherein the electron microscope includes at least one direct imaging sensor configured to directly image the virtual sample plane image.

24. The system of claim 23, wherein the at least one direct imaging sensor includes at least one of a CCD detector or a CMOS detector.

25. The system of claim 18, wherein the translation unit comprises:
one or more motorized screw devices; and
one or more threaded guide rails, wherein the one or more motorized screw devices are configured to translate the electron microscope via the one or more threaded guide rails.

26. The system of claim 18, further comprising:
a bellows assembly encompassing at least a portion of the electron microscope and configured to selectively translate the electron microscope along the optical axis of one or more lithography optics of the electron beam lithography tool.

27. The system of claim 26, wherein the bellows assembly is further configured to provide a vacuum barrier between one or more optical elements of the electron microscope and a low pressure environment of a vacuum chamber of the lithography tool.

28. The system of claim 18, wherein the docking system comprises:
a first docking unit disposed on the electron microscope; and
a second docking unit disposed on the lithography tool, wherein the first docking unit is configured to reversibly mechanically couple with the second docking unit.

29. A system for providing electron beam lithography image enhancement, comprising:
an electron beam lithography tool, the electron beam lithography tool including a lithography stage, the lithography stage disposed within a lithography tool vacuum chamber;
an electron microscope embedded within the lithography stage of the electron beam lithography tool, the electron microscope including one or more magnifying lenses oriented about an optical axis of the electron microscope, wherein the electron microscope is disposed within the lithography tool vacuum chamber, the electron microscope arranged within the lithography stage of the electron beam lithography tool such that the electron microscope has a line-of-sight to one or more lithography optics of the electron beam lithography tool, the one or more magnifying lenses of the electron microscope configured to magnify a virtual sample plane image generated by the electron beam lithography tool.

30. The system of claim 29, wherein the electron microscope includes at least one imaging device configured to image the magnified virtual sample plane image.

31. A method for providing electron beam lithography image enhancement, comprising:
providing an electron microscope including one or more magnifying lenses oriented about an optical axis of the electron microscope;
selectably positioning the electron microscope below an aperture of a lithography stage of an electron beam lithography tool such that the electron microscope has a line-of-sight to one or more lithography optics of the electron beam lithography tool;
magnifying a virtual sample plane image generated by the electron beam lithography tool utilizing the one or more magnifying lenses;
projecting the magnified virtual sample plane image onto an imaging device of the electron microscope; and
collecting image information from the imaging device.

32. The method of claim 31, wherein the one or more magnifying lenses comprise:
a plurality of magnifying lenses.

33. The method of claim 31, wherein the one or more magnifying lenses comprise:
a single magnifying lens.

34. The method of claim 31, wherein the one or more magnifying lenses comprise:
at least one of one or more magnetic magnifying lenses and one or more electrostatic magnifying lenses.

35. The method of claim 31, wherein the imaging device of the electron microscope includes at least one electron imaging screen.

36. The system of claim 35, wherein the electron imaging screen comprises:
at least one of a YAG screen, a YAP screen, and a phosphorous screen.

37. The method of claim 35, wherein the imaging device of the electron microscope includes at least one camera configured to collect one or more light images emitted by the at least one electron imaging screen.

38. The method of claim 31, wherein the imaging device of the electron microscope includes at least one direct imaging sensor configured to directly image the magnified virtual sample plane image.

39. The method of claim 38, wherein the at least one direct imaging sensor includes at least one of a CCD detector or a CMOS detector.

\* \* \* \* \*